(12) United States Patent
Menath et al.

(10) Patent No.: US 9,183,977 B2
(45) Date of Patent: Nov. 10, 2015

(54) METHOD FOR FABRICATING A COIL BY WAY OF A ROUNDED TRENCH

(75) Inventors: Markus Menath, Regensburg (DE); Thomas Fischer, Regensburg (DE); Hermann Wendt, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/452,669

(22) Filed: Apr. 20, 2012

(65) Prior Publication Data

US 2013/0277797 A1 Oct. 24, 2013

(51) Int. Cl.
| | |
|---|---|
| H01L 21/50 | (2006.01) |
| H01F 38/14 | (2006.01) |
| H01L 21/02 | (2006.01) |
| H01F 17/02 | (2006.01) |
| H01L 23/522 | (2006.01) |
| H01L 23/64 | (2006.01) |
| H01L 49/02 | (2006.01) |
| H01F 17/00 | (2006.01) |
| H01F 41/04 | (2006.01) |
| H01L 21/768 | (2006.01) |
| H01L 23/528 | (2006.01) |
| H01L 21/027 | (2006.01) |
| H01L 27/08 | (2006.01) |

(52) U.S. Cl.
CPC ............ *H01F 17/02* (2013.01); *H01F 17/0006* (2013.01); *H01F 41/042* (2013.01); *H01L 21/76816* (2013.01); *H01L 23/5227* (2013.01); *H01L 23/64* (2013.01); *H01L 28/10* (2013.01); H01L 21/0274 (2013.01); H01L 21/76804 (2013.01); H01L 21/76877 (2013.01); H01L 23/5283 (2013.01); H01L 27/08 (2013.01); H01L 2224/48095 (2013.01); H01L 2224/48137 (2013.01); Y10T 29/4902 (2015.01)

(58) Field of Classification Search
CPC . H01L 23/5283; H01L 23/5227; H01L 28/10; H01L 21/76804; H01F 17/04
USPC ......................................................... 438/756
See application file for complete search history.

(56) References Cited

U.S. PATENT DOCUMENTS

| | | | | |
|---|---|---|---|---|
| 4,906,590 | A | * | 3/1990 | Kanetaki et al. ............... 438/386 |
| 5,795,823 | A | * | 8/1998 | Avanzino et al. .............. 438/639 |
| 6,093,330 | A | * | 7/2000 | Chong et al. ....................... 216/2 |
| 6,313,008 | B1 | | 11/2001 | Leung et al. |
| 6,475,916 | B1 | * | 11/2002 | Lee et al. ....................... 438/706 |
| 6,833,079 | B1 | | 12/2004 | Giordani |
| 6,960,519 | B1 | * | 11/2005 | Dalton et al. .................. 438/617 |

(Continued)

FOREIGN PATENT DOCUMENTS

CN 1866523 A 11/2006

OTHER PUBLICATIONS

Münzer, M., et al., "Coreless transformer a new technology for half bridge driver IC's," May 17, 2006, pp. 1-4, Infineon Technologies, Muenchen, Germany.

*Primary Examiner* — Victor A Mandala
*Assistant Examiner* — Regan J Rundio
(74) *Attorney, Agent, or Firm* — Slater & Matsil, L.L.P.

(57) ABSTRACT

A method for manufacturing an electronic device and an electronic device are disclosed. In an embodiment the method comprises forming an opening in an isolation layer, isotropically etching the opening thereby forming an extended opening with curved sidewalls, and forming a conductive material in the opening.

16 Claims, 12 Drawing Sheets

(56) References Cited

U.S. PATENT DOCUMENTS

| | | |
|---|---|---|
| 7,582,532 B2 * | 9/2009 | Han et al. ................. 438/270 |
| 2002/0008605 A1 | 1/2002 | Gardner |
| 2006/0263991 A1 | 11/2006 | Lee et al. |
| 2007/0004194 A1 | 1/2007 | Cho et al. |
| 2007/0122956 A1 * | 5/2007 | Chidambarrao et al. ..... 438/197 |
| 2007/0123031 A1 * | 5/2007 | Isogai ........................ 438/624 |
| 2008/0079090 A1 | 4/2008 | Hwang et al. |
| 2008/0157194 A1 * | 7/2008 | Lee et al. .................... 257/334 |
| 2008/0203455 A1 * | 8/2008 | Jang et al. ................... 257/306 |
| 2008/0296667 A1 * | 12/2008 | Mikasa ........................ 257/327 |
| 2010/0165048 A1 * | 7/2010 | DeBrabander et al. ........ 347/47 |
| 2011/0156854 A1 | 6/2011 | Lee |
| 2011/0241160 A1 * | 10/2011 | Kerber et al. ................ 257/528 |
| 2014/0138351 A1 * | 5/2014 | Mancarella et al. ........... 216/37 |

* cited by examiner

METHOD FOR FABRICATING A COIL BY WAY OF A ROUNDED TRENCH

TECHNICAL FIELD

The present invention relates to a coil and a method of manufacturing a coil, and, in particular embodiments, to a transformer and a method of manufacturing a transformer.

BACKGROUND

Generally, discrete transformers and optocouplers are used to transmit signals from one electrical circuit to another electrical circuit without direct electrical contact between the two electrical circuits. However, discrete transformers and optocouplers are relatively large, heavy, and expensive, and in the case of optocouplers, aging may be a problem.

Another way to transmit signals from one electrical circuit to another electrical circuit without direct electrical contact is a coreless transformer. While a discrete transformer comprises a core to direct the magnetic flux, the coils of a coreless transformer can be placed close enough to each other so that the core can be spared.

SUMMARY OF THE INVENTION

In accordance with an embodiment of the present invention, a method for manufacturing an electronic device comprises forming an opening in an isolation layer, isotropically etching the opening thereby forming an extended opening with curved sidewalls, and forming a conductive material in the opening.

In accordance with an embodiment of the present invention, a method for manufacturing a semiconductor device comprises forming an opening in an isolation layer, the opening comprises sidewalls and a bottom surface, forming a second material layer along the sidewalls of the opening in the isolation layer and extending the opening in the isolation layer so that the extended opening lacks edges. The method further comprises removing the second material layer and filling the extended opening with a conductive material.

In accordance with an embodiment of the present invention, a method for manufacturing a semiconductor device comprises forming a first coil in a substrate, forming an isolation layer over the substrate comprising the first coil, and forming a second coil in the isolation layer substantially aligned with the first coil. Forming the second coil comprises forming an opening in the isolation layer, forming sidewall spacers along sidewalls of the opening in the isolation layer, isotropically etching the opening in the isolation layer thereby forming an extended opening, and depositing a conductive material in the extended opening.

In accordance with an embodiment of the present invention, a semiconductor device comprises an isolation layer disposed on a semiconductor substrate, and a first coil disposed in the isolation layer, wherein a cross sectional shape of the first coil is curved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a coil. The invention may also be applied, however, to a coreless transformer, to a discrete transformer or to a device comprising a coil.

Figure 1A:
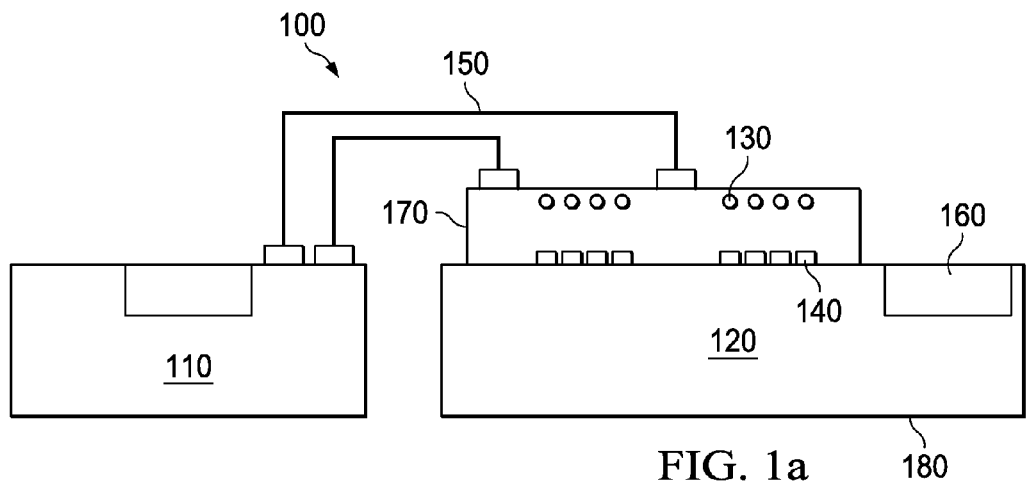
FIG. 1a shows an embodiment of a coreless transformer.

Referring now to FIG. 1a, an embodiment of a coreless transformer 100 is shown. The coreless transformer comprises two semiconductor chips, a first semiconductor chip 110 and a second semiconductor chip 120. The first semiconductor chip 110 may comprise a transmitter, a receiver, a transceiver or any other kind of integrated circuit. The second semiconductor chip 120 may comprise a transmitter, a receiver, a transceiver or any other kind of integrated circuit. The second semiconductor chip 120 further comprises a primary coil 130 and a secondary coil 140. The first semiconductor chip 110 and the second semiconductor chip 120 are electrically connected, for example, via bond wires 150. Alternatively, the first semiconductor chip 110 and the second semiconductor chip 120 may be electrically connected via a bus system or via other electrical connections.

The first integrated circuit chip 110 may be electrically connected to the primary coil 130 and the integrated circuit 160 of the second integrated circuit chip 140 may be electrically connected to the secondary coil 140. In one embodiment the primary coil 130 and the secondary coil 140 are processed on wafer level.

The primary coil 130 is separated from the secondary coil 140 via an isolation layer 170. The secondary coil 140 is disposed in or on the semiconductor substrate 180 and the primary coil 130 is disposed in or on the isolation layer 170. If the primary coil 130 and the secondary coil 140 are disposed close enough, electrical signals can be transmitted between the primary coil 130 and the secondary coil 140 through electromagnetic coupling.

In one embodiment the coreless transformer 100 comprises three semiconductor chips, a first semiconductor chip comprising an integrated circuit and a second semiconductor chip comprising an integrated circuit. Each of the first and second integrated circuits may comprise a transmitter, a receiver, a transceiver or any other kind of integrated circuit. The third semiconductor chip comprises a primary coil and a secondary coil. The third semiconductor chip may be from material different than semiconductor materials. The first integrated circuit chip is electrically connected to the primary coil of the third semiconductor chip and the second semiconductor chip is electrically connected to the secondary coil of the third semiconductor chip.

Figure 1B:
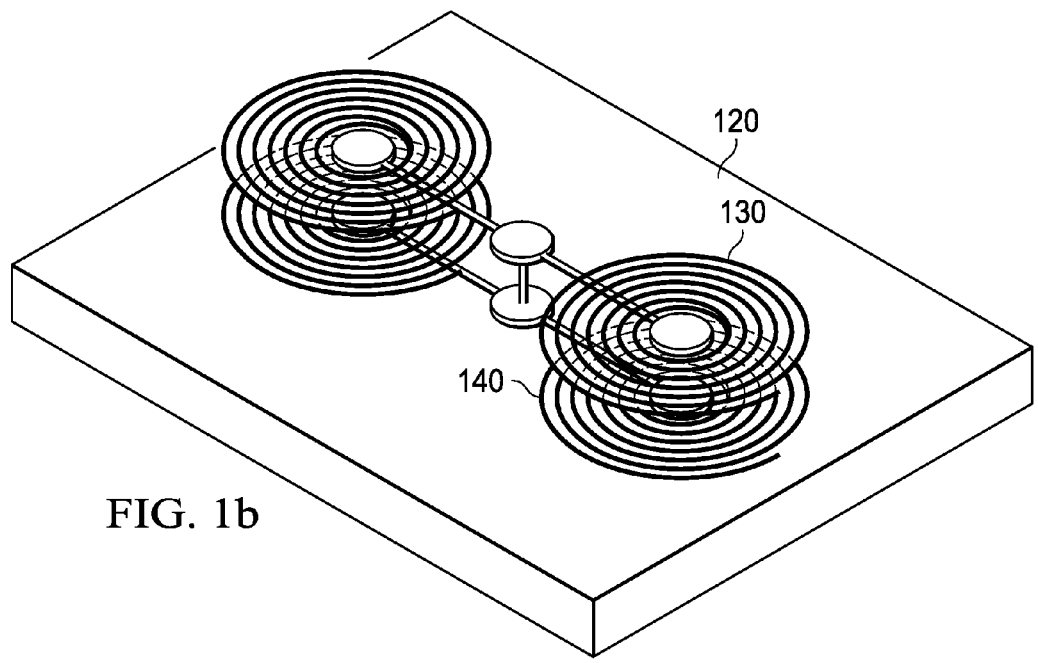
FIG. 1b shows a three-dimensional view of two primary and two secondary coils.

FIG. 1b shows a three dimensional detailed view of a coil arrangement 100 comprising two primary and two secondary coils 130, 140 disposed in a substrate 120. Two coils 130, 140 may be used to transmit information or data in a differential mode to optimize the Common Mode Transient Immunity (CMTI). Alternatively, only one coil may be used but the CMTI robustness may not be so high. The coil arrangement 100 may be integrated with an IC as describe with respect to FIG. 1a or may be a stand along device wherein the primary coils 130 are electrically connected to a first stand-alone IC chip, and wherein the secondary coils 140 are electrically connected to a second stand-alone IC chip.

In a conventional transformer design a 14 μm PSG (Phosphoric Silicon Glass) isolation layer is disposed between the two coils. The primary coil is formed through a copper (Cu) damascene metallization process scheme. The secondary coil 140 is formed through an aluminum (Al) metal back end of line (BEOL) process scheme. A disadvantage of a coil design resulting from these processes is that the two coils are not able to withstand a voltage pulse of 11 kV, and a continuing charging up by 9 kV.

The problem with such a design is that Cu damascene metallization process scheme produces trenches with vertical sidewalls and a horizontal bottom surface which leads to sharp edges where the sidewalls and the bottom surface meet. Under operating conditions the coreless transformer may create excessive electrical field strength at the crossover of the sidewalls and the bottom surface. This excessive electrical field strength and not the regular field strength determine the dielectric strength of the transformer.

Moreover, copper and phosphoric silicon glass have substantially different thermal expansion coefficients. The substantially different thermal expansion coefficient may lead to mechanical stress which in turn may lead to cracks in the phosphoric silicon glass decreasing the lifetime expectancy and the reliability of the transformer.

In one embodiment the shape of a coil avoids or reduces excessive electrical field strength relative to a coil with edges or angles. In one embodiment a cross sectional shape of the coil is curved. A curved vertical cross sectional shape of the coil may be defined as free from angularity, as a continuously bending line without angles, as having no edges, or as being substantially round, substantially oval or substantially circular.

In one embodiment a method comprises forming sidewall spacers in an opening of an isolation layer and isotropically etching the bottom surface of the opening thereby forming an extended opening having a curved surface. In one embodiment a method comprises isotropically wet etching or isotropically dry etching an opening of an isolation layer thereby forming an extended opening having a curved surface.

In one embodiment the sidewall spacers in the opening are formed by depositing a material layer on sidewalls and the bottom surface of an opening and anisotropically removing the material layer overlying the bottom surface of the opening. In one embodiment the sidewall spacers in the opening are formed by depositing a photoresist layer on sidewalls and the bottom surface of an opening and exposing, developing and removing only the material layer overlying the bottom surface of the opening.

It is advantageous that excessive electrical field strength within the isolating layer can be reduced or avoided.

FIGS. 2a-2i illustrates cross-sectional views of a semiconductor device including a coil according to embodiments of the invention in various stages of fabrication.

A semiconductor device 200 includes an isolation layer 220, a first material layer 230 and a mask layer 240. The isolation layer 220 may be deposited on a semiconductor substrate (not shown). A secondary coil may be disposed in or on the semiconductor substrate.

The isolation layer 220 may be an oxide such as silicon oxide or phosphoric silicon glass (PSG). Alternatively, the isolation layer 220 may be a low-k-material such as fluorinated oxides, or a combination of the low-k material with silicon oxide. In one embodiment the low-k material is not porous low-k-material. The isolation layer 220 may be between about 1 μm and about 100 μm thick. In one specific example, the isolation layer 220 may be between about 10 μm to about 20 μm thick or 14 μm thick. The isolation layer 220 may be formed using a chemical vapor deposition (CVD) process, e.g., a plasma enhanced CVD process.

A first material layer 230 is disposed over the isolation layer 220. In one embodiment the first material layer 230 has the following individual or combined properties or characteristics: The material of the first material layer 230 has a lower etching rate (e.g., in HF based wet etching) for a particular etching chemistry than the material of the isolation layer 220. The material of the first material layer 230 is selective to the material of the isolation layer 220. The first material layer 230 is mechanically stable so that in a cleaning process spacers formed in the material layer 230 do not break or do not cling together.

In one embodiment, the first material layer 230 comprises polycrystalline silicon. Polycrystalline silicon withstands an application of a HF based etching chemistry and can be highly selectively removed relative to the material of the isolation layer 220. Alternatively, the first material layer 230 may comprise a nitride such as a silicon nitride. For example, the silicon nitride is formed in a low pressure chemical vapor deposition (LPCVD). The etching rate of LPCVD silicon nitride is 500 times lower than the etching rate of plasma enhanced PECVD deposited PSG material of the isolation layer 220. Moreover, LPCVD silicon nitride can be removed with hot (e.g., temperature range ~150° C.) phosphoric acid (e.g., $H_3PO_4$ (80%)) or plasma etching while the material of the isolation layer 220 may not be attacked with these etching processes.

In a further embodiment, the first material layer 230 comprises an oxide such as a silicon oxide. The silicon oxide may be a thermal oxide.

In a further embodiment, the first material layer 230 may comprise a metal such as titanium tungsten (TiW). Metals may not be etched in a HF based etching chemistry but may be selectively removed by applying ammonia/hydrogen peroxide (e.g., $NH_4OH/H_2O_2$).

In a final embodiment, the first material layer 230 may comprise carbon, a resist or an imide. Carbon or a resist are resistant against an application of an HF based etching chemistry while they can be selectively removed with $O_2$ plasma.

The first material layer 230 may be between about 100 nm and about 1000 nm thick. In a particular example, the first material layer 230 is between about 100 nm to about 400 nm thick.

The mask layer 240 may be a hard mask or a photoresist. For example, the hard mask may be an oxide such as a silicon oxide or a nitride such as silicon nitride. Alternatively, the photoresist may be an imide. The mask layer 240 is patterned and an opening is formed.

Figure 2A:
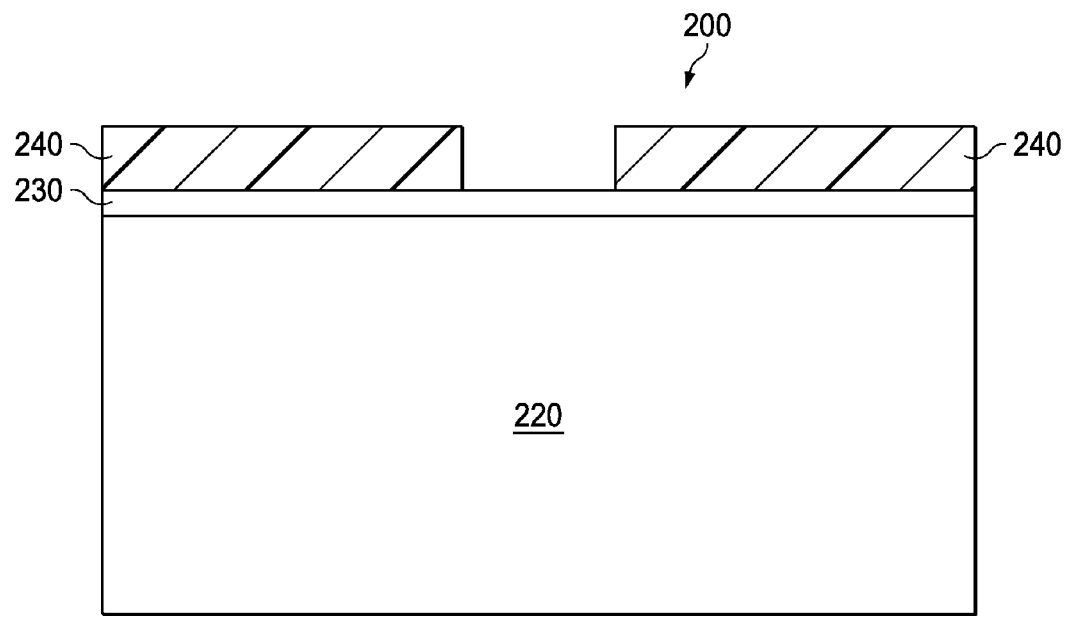
FIGS. 2a-2i illustrate cross-sectional views of a semiconductor device including a coil according to embodiments of the invention in various stages of fabrication.
Figure 2B:
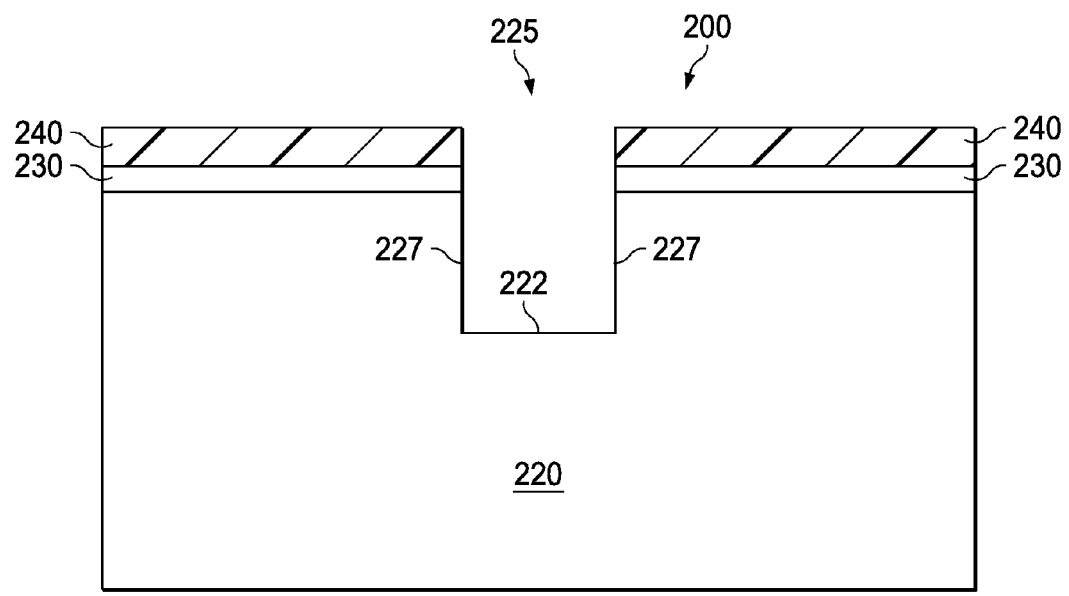

In FIG. 2b, the first material layer 230 and the isolation layer 220 are anisotropically etched through the patterned mask layer 240 and an opening 225 is formed into the isolation layer 220. The anisotropical etch may be a plasma etch process based on fluorine chemistry. The etching chemistry may be $CF_4/CHF_3$ and Ar or $SF_6/Ar$. The opening 225 comprises sidewalls 227 and a bottom surface 222. The opening 225 may comprise a trench. The opening may be about 0.2 µm to about 3 µm deep, or alternatively, about 1 µm deep.

After forming the opening 225, the mask layer 240 is removed. The mask layer 240 can be removed by an $O_2$ plasma or liquid photoresist stripper.

Figure 2C:
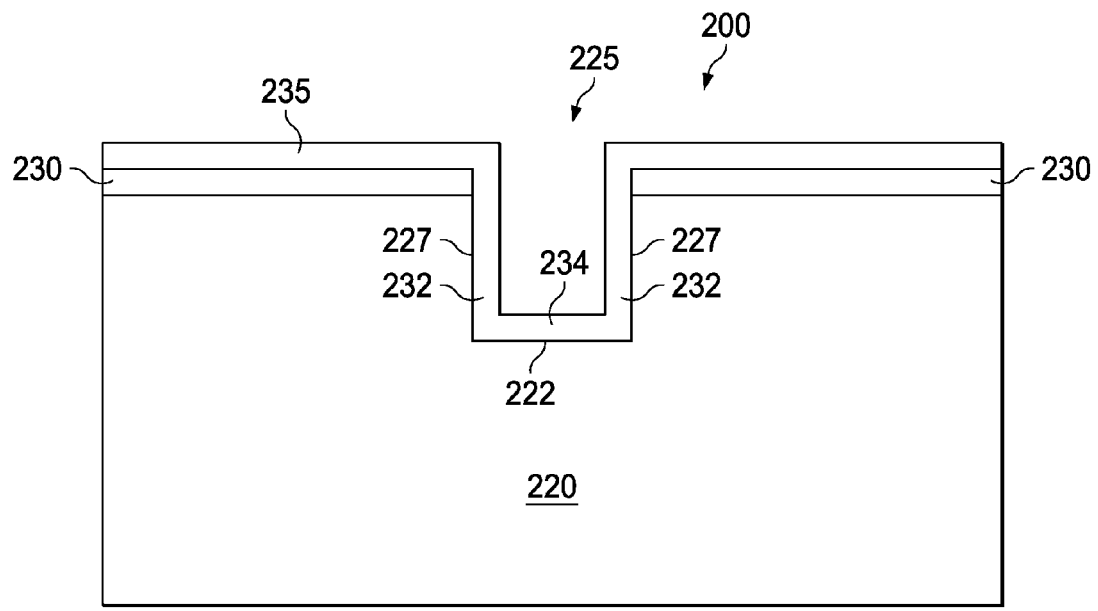

In FIG. 2c, an optional second material layer 235 is formed along the sidewalls 227 and the bottom surface 222 of the opening 225, and over the top surface of the semiconductor device 200. The optional second material layer 235 may be the same as the first material layer 230 or may be different. In one embodiment, the optional second material layer 235 comprises the same properties, characteristics and materials as described for the first material layer 230. The optional second material layer 235 may be between about 50 nm and about 1000 nm thick. In a particular example, the optional second material layer 235 is between about 100 nm to about 400 nm thick.

The deposition of the optional second material layer 235 may form the spacers 232 along the sidewalls 227 of the opening 225 and a bottom coverage 234 overlying the bottom surface 222 of the opening 225.

Figure 2D:
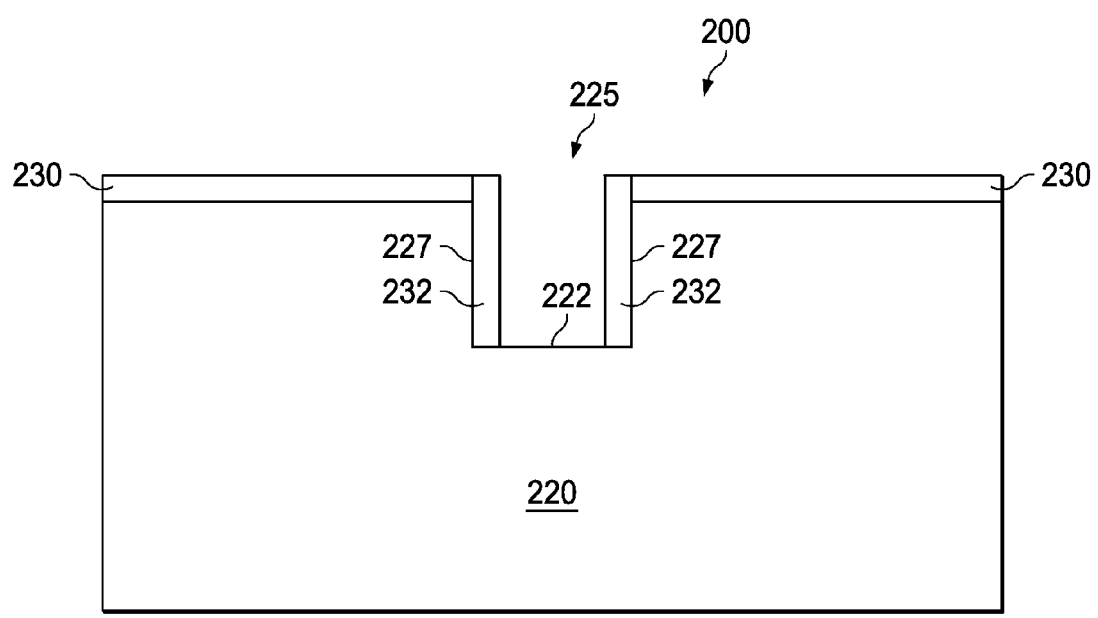

As shown in FIG. 2d, an anisotropical etch is performed removing the bottom coverage 234 of the optional second material layer 235. The anisotropical etch may be a dry etch such as fluorine etching chemistry (e.g., $CF_4/CHF_3$ and Ar or $SF_6/Ar$). The removal of the bottom coverage 234 exposes the bottom surface 222 of the opening 225 creating a point where a subsequent etch can be applied. The sidewall spacers 232 may not or may only barely be etched and remain intact. The sidewall spacers 232 may cover the entire depth of the sidewalls 227 or only a portion of the depth of the sidewalls 227. The trench depth to sidewall spacer depth can be 7/10, for example, but many different ratios up to a 1/10 ratio are possible. The ratios may be achieved by extending the opening 225 further into the isolation layer 220.

Figure 2E:
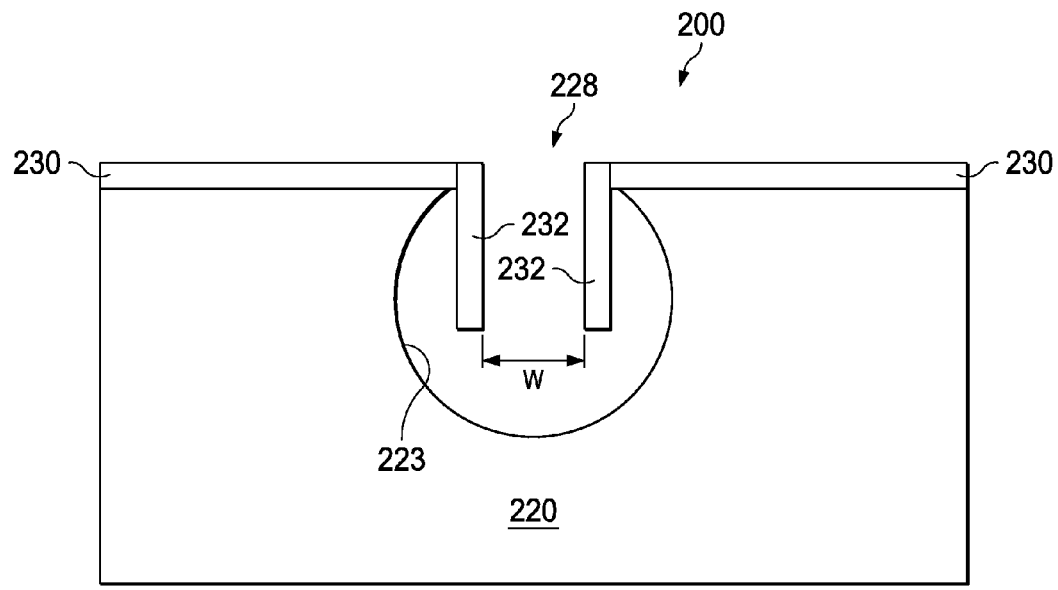
Figure 2F:
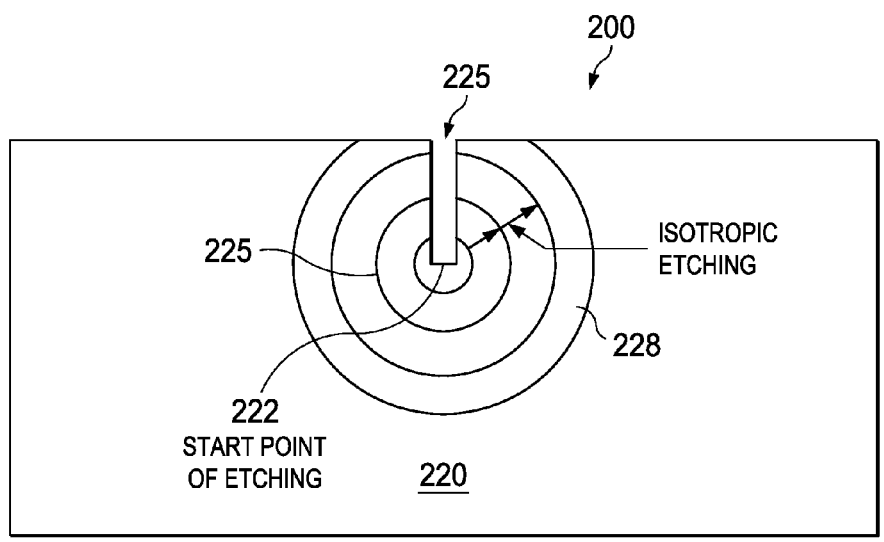
Figure 4A:
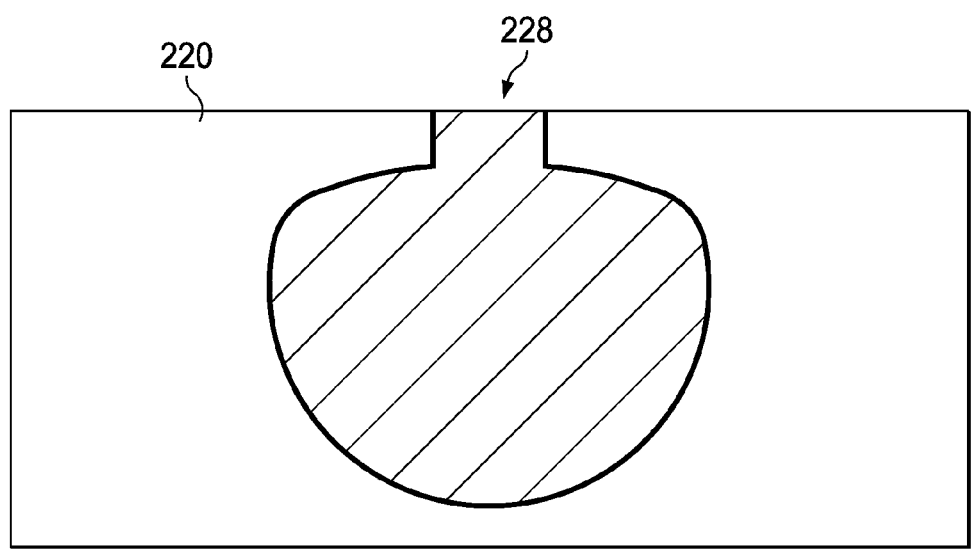
FIG. 4a shows an extended opening after performing an isotropic etch with sidewall spacers.

Next, as shown in FIG. 2e, an isotropic etch is applied to the opening 225 of the semiconductor device 200. The isotropic etch may be applied to the bottom surface 222 of the opening 225. The removal of the isolation layer 220 material starts at the exposed bottom surface 222 of the opening 225 and extends the opening 225 forming an extended opening 228. Alternatively, the removal of the isolation layer 220 material starts at the exposed sidewalls 227 and the bottom surface 222 of the opening 225. FIG. 2f shows how the application of the isotropic etch chemistry etches through the isolating material of the isolation layer 220. Because the isotropic etch is selective to the first material layer 230 and the remains of the second material layer 235 (including the sidewall spacers), the etch removes isolation layer 220 material but not or only barely the material of the first material layer 230 and/or the second material layers 235. FIG. 4a shows an extended opening 228 after performing the isotropic etch with sidewall spacers 232.

Figure 4B:
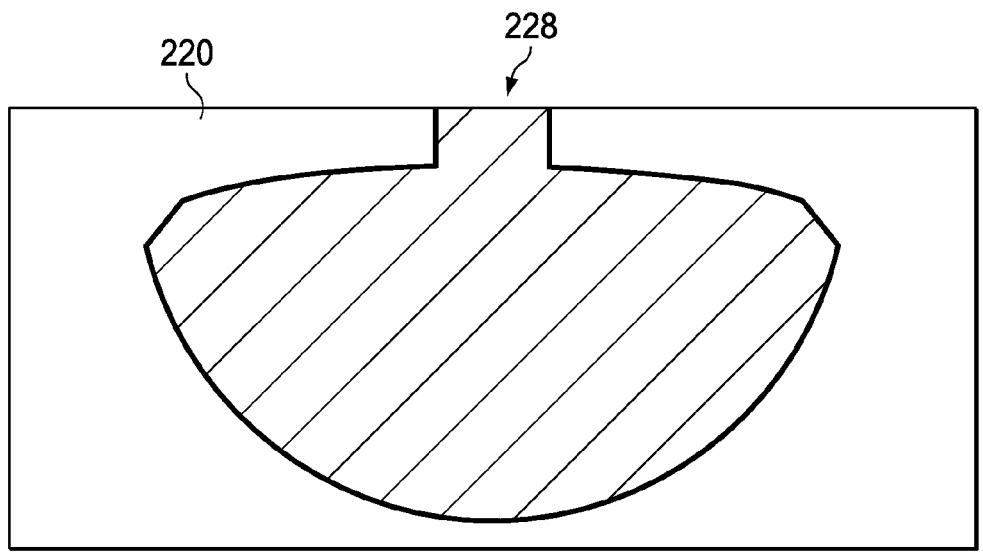
FIG. 4b shows an extended opening after performing an isotropic etch without sidewall spacers.

Alternatively, if the optional second material layer 235 is not deposited, the removal of the isolation layer 220 material starts at the sidewalls 227 and the bottom surface 222 of the opening 225. FIG. 4b shows the extended opening 228 after performing the isotropic etch without sidewall spacers.

FIGS. 4a and 4b show an extended opening 228 with curved sidewalls along a vertical cross section (360 degree) extended opening. The radius of curvature for the extended opening 228 may be substantially the same (as shown in FIG. 4a) or may be different (as shown in FIG. 4b). In one embodiment of FIG. 4a, the radius of curvature is substantially the same for at least about 90 degrees or at least about 180 degrees of the (360 degree) cross sectional view of the opening 228. Alternatively, the radius of curvature is substantially the same for at least about 240 degrees of the cross section. Still alternatively, the radius of curvature is substantially the same for at least about 45 degrees or at least about 90 degrees in a lower left region and/or in a lower right region. The radius of curvature in the lower left region may be substantially the same than the radius of curvature in the lower right region.

The radius of curvature in the upper region may remain substantially the same for at least about 45 degrees in the upper left region and/or in the upper right region. The radius of curvature in an upper region may be the same or may be different than the radius of curvature in the lower region. In the region between the lower region and the upper region the radius of curvature may slowly change.

The radius of curvature for the extended opening 228 shown in FIG. 4b may remain substantially the same for portions of the lower region. For example, the radius of curvature remains substantially the same for a lower left region and/or a lower right region. The radius of curvature remains substantially the same for at least up to about 45 or at least up to about 90 degrees for the lower left region and the lower right region, respectively. The lower left region and the lower right region may be separated by a lower intermediate region, e.g., a substantially flat region. The lower intermediate region may have a different radius of curvature than the radii of the other two lower portions.

The radius of curvature may be different for the upper region than the radii in the lower regions. The radius of curvature may change abruptly one or several times in the upper region. The radius of curvature may not remain substantially the same over large portions of the upper region. For example, the radius of curvature may not remain substantially the same for or up to about 90 degrees.

The isotropic etch forms an extended opening 228 with a curved shape in a cross sectional view. The curved cross sectional shape of the extended opening 228 may be defined as free from angularity, as a continuously bending line without angles, as having no edges, or as being substantially round, substantially elliptical, substantially oval or substantially circular.

In some embodiment the curved shape of the extended opening 228 is substantially homogenous curved or comprises substantially homogeneous curved sidewalls over the entire cross section, as shown in FIG. 4a, for example. The extended opening 228 has substantially the same rounding radius at a top portion of the extended opening 228 and at a bottom portion of the extended opening 228. In other embodiments the curved shape of the extended opening 228 is different in different portions of the cross section or the curved sidewalls. For example, as shown in FIG. 4b, the rounding radius or the curved sidewall shape in a top portion of the extended opening 228 is different than the rounding radius or the curved sidewall shape in a bottom portion of the extended opening 228.

In one embodiment the isotropic etch removes the isolation material in a substantially circular or substantially oval fashion around the starting point or the starting area, e.g., the bottom surface 220, so that an extended opening 228 with a curved cross sectional view is formed in the isolation material. The surface 223 of the extended opening 228 may be smooth without any edges. The width w of the opening where the isotropic etch may start is defined or adjusted by the width of the opening 225 and the width of the sidewall spacers 232. For example, in one embodiment the width of the opening is 900 nm, and the width of the two sidewall spacers is each 300 nm so that the width w where the isotropic etch may start is 300 nm. A rule of thumb for forming the extended opening via the isotropic etch may be: the smaller the width w of the bottom surface of the opening the more circular the extended opening 228. Varying the width w varies the shape of the extended opening 228 in a cross sectional view.

The dimensions of the depth of the opening 225 and the width w of the opening 225 depend on the desired dimensions of the extended opening 228, e.g., the coil dimensions. An extended opening 228 formed by such an isotropic etch process and filled with a conductive material avoids or reduces excessive electrical field strength under operation.

FIG. 2f also shows that the longer the isotropic etch is applied the larger the diameter of the extended opening 228. In case there is no direct endpoint detection method available for the isotropic etch, a strict control of the etch rate influencing process parameters (temperature, etch chemistry concentration, isolation material properties) may be used.

The isotropic etch may comprise a wet etch. In one embodiment the wet etch comprises a HF (hydrogen fluoride) etching chemistry or a mixture thereof (e.g., $NH_4F$:HF with a typical ratio of 30:6). Various etching rates can be achieved by varying the HF concentration and/ or the temperature of the etching mixture. HF etch rates on an oxide may be dependent on the properties and characteristics of the oxide. For example, a boron doped silicon oxide may etch slower than an undoped silicon oxide, while phosphorus or other 5-valant doped silicon oxide may etch faster than an undoped silicon oxide. Oxide density may also affect the etch rate. A dense oxide may etch slower than a not so dense oxide. Alternatively, the isotropic etch may comprise an isotropic dry etch (e.g., $NF_3$ or $SF_6$).

After the isotropic etch is carried out the sidewall spacers 232 may remain intact. The sidewall spacers 232 may not be etched by the isotropic etch. The sidewall spacers 232 may remain free standing extending in the extended opening 228 since the sidewalls 227 of the original trench 225 have been removed by the isotropic etch.

After the isotropic etch the semiconductor device 200 may be cleaned and/or dried. In one embodiment the sidewall spacers 232 have enough mechanical strength to withstand bending or breaking during cleaning and drying. Alternatively, if the sidewall spacers 232 do not have enough mechanical strength, supercritical drying can be used.

Figure 2G:
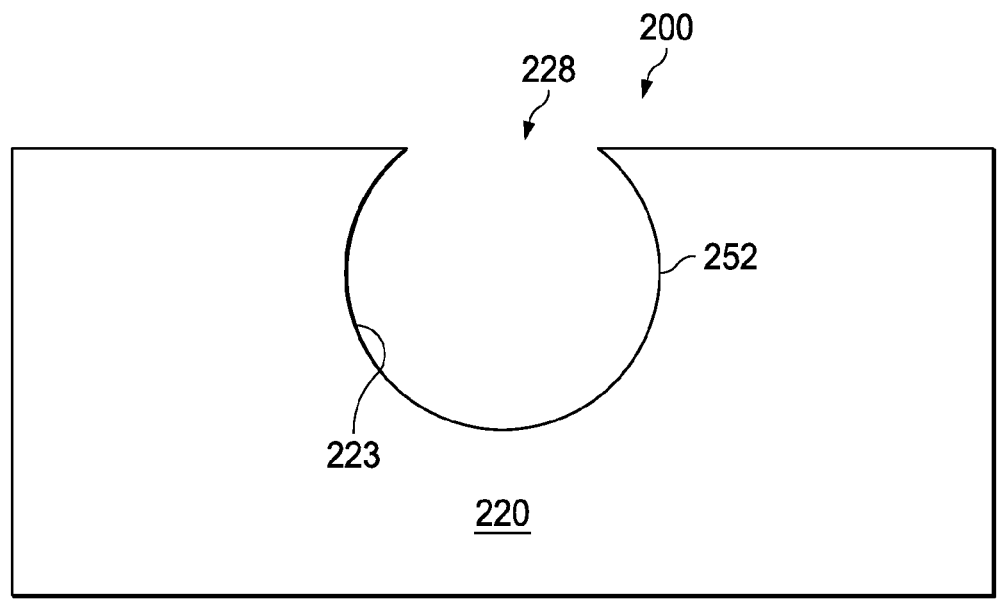

As can be seen from FIG. 2g, the first material layer 230 and the remains of the optional second material layer 235 (e.g., sidewall spacers 232) are removed from top surface of the isolation layer 220 and in the extended opening 228. The first and the optional second material layers 230, 235 may be removed in one etching step if they are from the same material or in two etching steps if they are from different materials. To remove the layers a hot phosphor acid (e.g., $H_3PO_4$) may be applied.

Figure 2H:
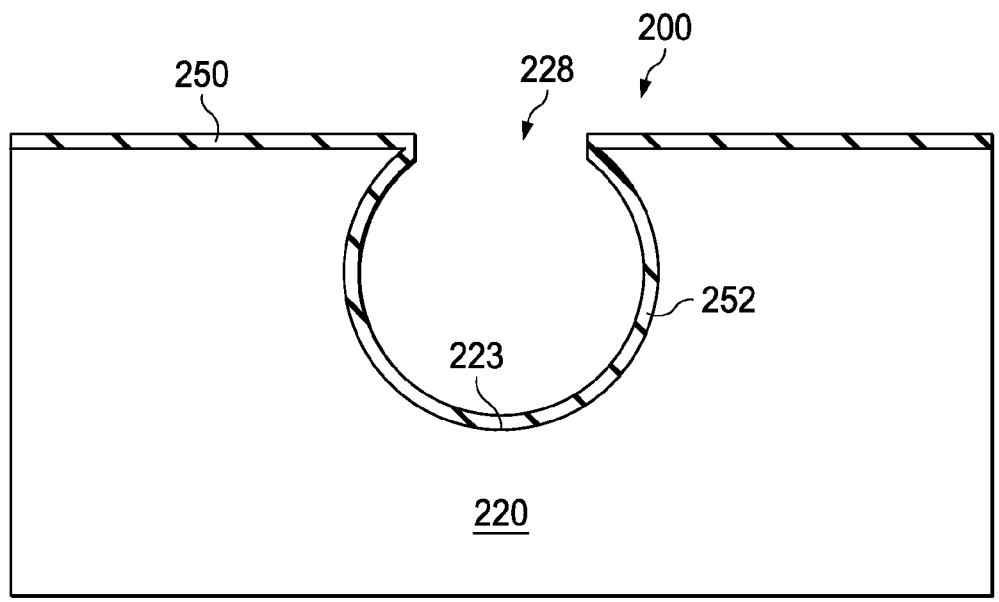

In FIG. 2h, a barrier layer 250 is formed on the top surface of the isolation layer 220 and on the surface 223 of the extended opening 228. The barrier layer 250 may comprise tantalum (Ta), tantalum nitride (TaN), titanium tungsten (TiW), or combinations thereof. The barrier layer 250 may be one layer or a plurality of layers. For example, the barrier layer may be a tantalum nitride (TaN)/tantalum (Ta) bi-layer. The barrier layer 250 may be between about 5 nm and about 100 nm thick. In a bi-layer arrangement each layer may be between about 5 nm and about 100 nm thick. The barrier layer 252 in the extended opening 228 may be of uniform thickness or may be thicker in a lower part of the extended opening 228 and thinner in an upper part of the extended opening 228. Generally, there should be at least a barrier layer 250 of about 5 nm thickness in the upper part of the opening.

The barrier layer 250 may be formed applying bias sputtering. Alternatively, the barrier layer 250 may be formed using a CVD process.

Figure 2I:
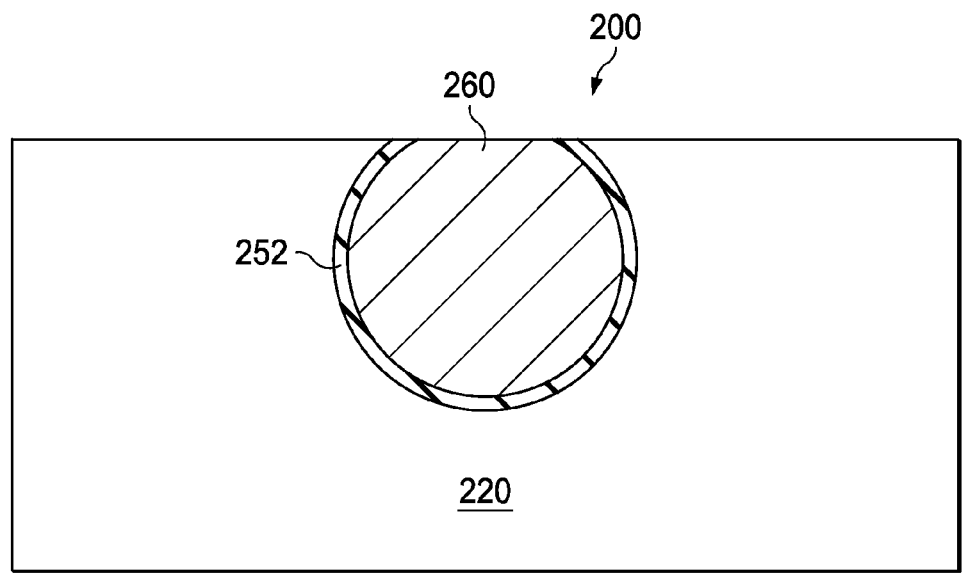

In FIG. 2i, the extended opening 228 may be filled with a conductive material 260. The conductive material 260 may be copper (Cu), copper alloys or aluminum (Al) or combinations thereof.

In one embodiment a conductive seed layer is formed or sputtered onto the barrier layer 250. The seed layer may cover the upper surface of the barrier layer 250 including the surface of the barrier layer 252 in the upper part of the extended opening 228. The extended opening 228 is then completely filled with the conductive material. The extended opening 228 may be filled through an electro-plating process or an electroless-plating process. In one embodiment a copper (Cu) seed layer is first formed in the extended opening 228 and the extended opening is then filled with a Cu electro-plating process.

In one embodiment the extended opening 228 is filled with a conductive material using a CVD process.

Conductive material formed outside of the extended opening 228 may be removed applying a chemical mechanical polishing (CMP) process, and a coil is formed in the isolation layer 220.

FIGS. 2a-2i only show the formation of a single coil winding in the isolation layer 220. However, the disclosed process covers also the formation of all windings in a coil as well as a plurality of coils in an isolation layer on a wafer, for example.

FIGS. 3a-3j illustrate cross-sectional views of a semiconductor device including a coil according to embodiments of the invention in various stages of fabrication.

A semiconductor device 300 includes an isolation layer 320 and a first mask layer 340. The isolation layer 320 may be deposited on a semiconductor substrate (not shown). A secondary coil may be disposed in or on the semiconductor substrate.

The isolation layer 320 may be an oxide such as silicon oxide or phosphoric silicon glass (PSG). Alternatively, the isolation layer 320 may be a low-k-material such as fluorinated oxides, or a combination of the low-k material with silicon oxide. In one embodiment the low-k material is not porous low-k-material. The isolation layer 320 may be between about 1 μm and about 100 μm thick. In one specific example, the isolation layer 320 may be between about 10 μm to about 20 μm thick or alternatively 14 μm thick. The isolation layer 320 may be formed using a chemical vapor deposition (CVD) process, e.g., a plasma enhanced CVD process.

The first mask layer 340 may be a photoresist. For example, the first mask layer may be an imide. The first mask layer 340 is patterned and an opening 345 is formed (FIG. 3a).

Figure 3A:
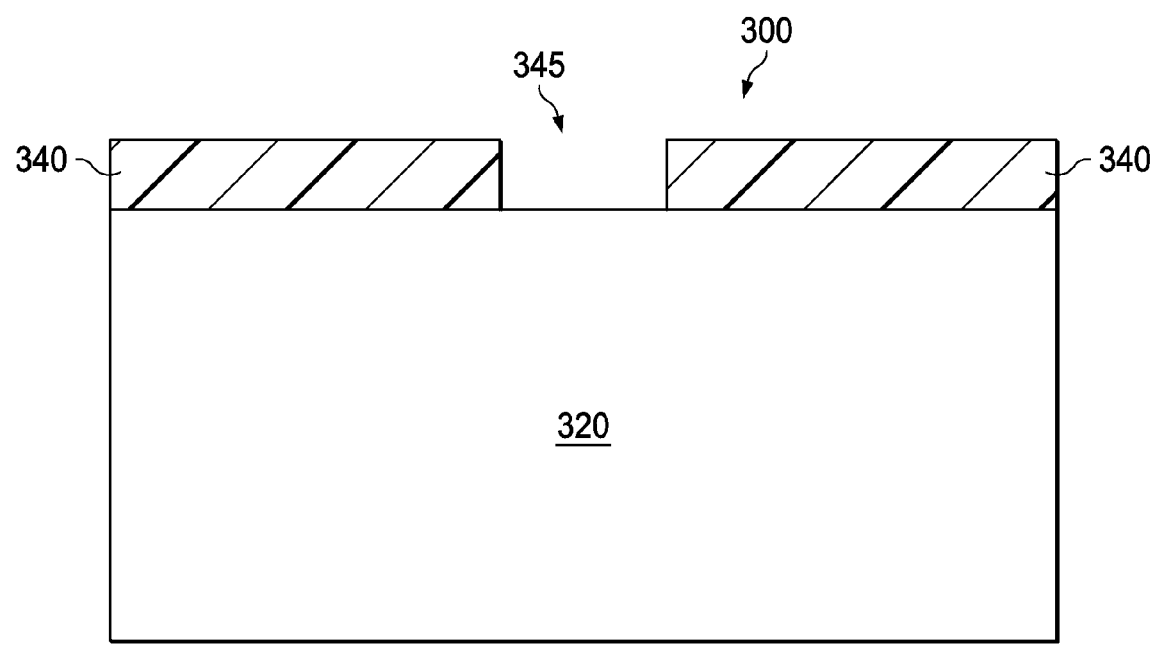
FIGS. 3a-3j illustrate cross-sectional views of a semiconductor device including a coil according to embodiments of the invention in various stages of fabrication.
Figure 3B:
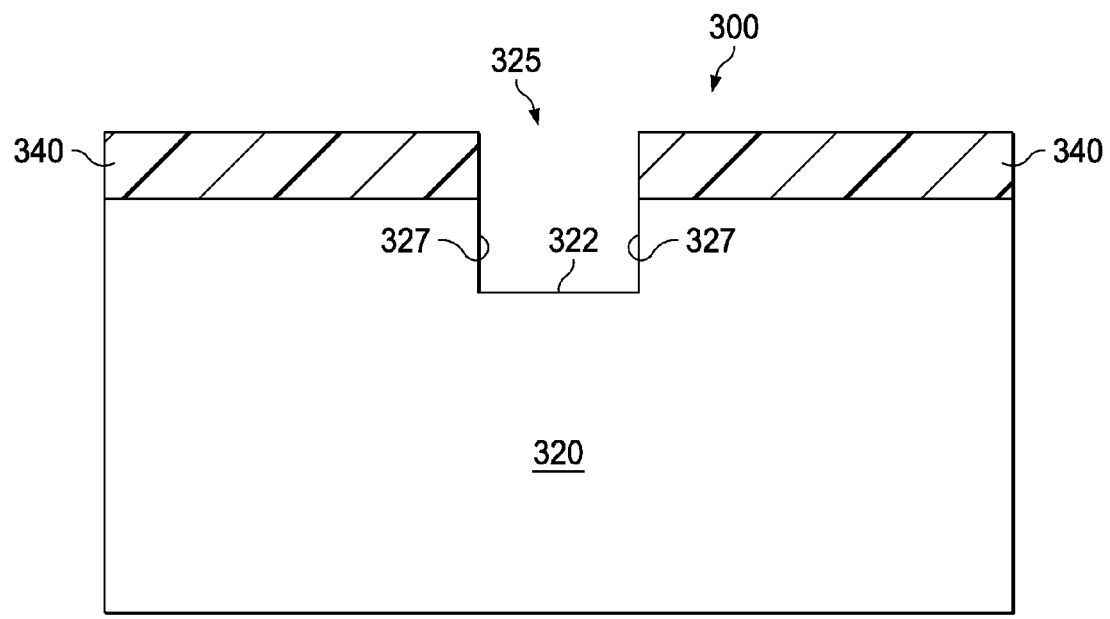

As shown in FIGS. 3a and 3b, the isolation layer 320 is anisotropically etched through the patterned first mask layer 340 and an opening 325 is formed into the isolation layer 320. The anisotropical etch may be a RIE such as plasma etch process based on fluorine chemistry. The etching chemistry may be $CF_4$/$CHF_3$ and Ar or $SF_6$/Ar. The opening 325 comprises sidewalls 327 and a bottom surface 322. The opening 325 may comprise a trench. The opening 325 may be about 0.2 μm to about 3 μm deep, or alternatively, about 1 μm deep.

Figure 3C:
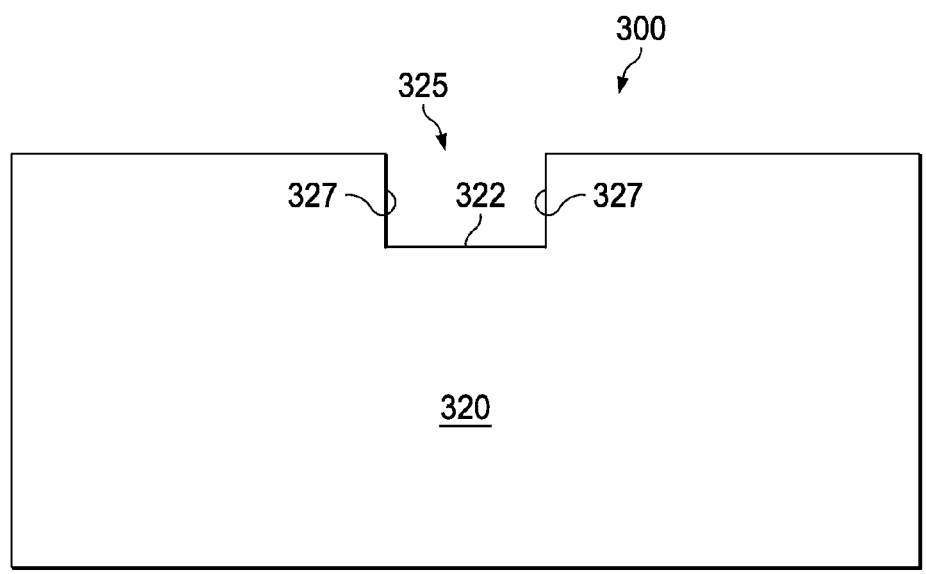

After forming the opening 325, the first mask layer 340 is removed or stripped. The first mask layer 340 can be removed by an O₂ plasma or liquid photoresist stripper. This is shown in FIG. 3c.

Figure 3D:
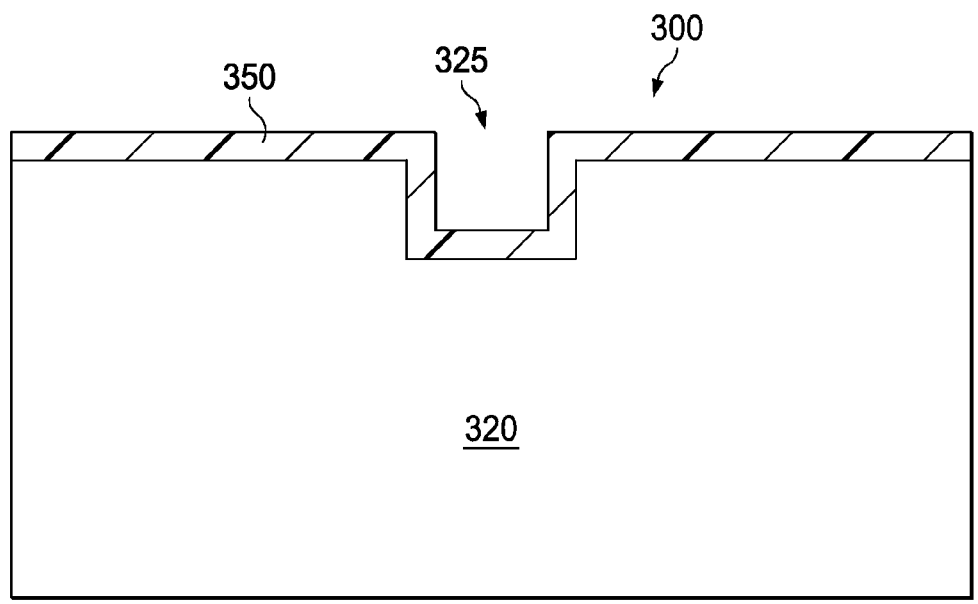

In FIG. 3d, a second mask layer 350 is formed over the top surface of the isolation layer 320, along the sidewalls 327 of the opening 325 and over the bottom surface 322 of the opening 325. The second mask layer 350 may be conformal disposed over the exposed surfaces of the isolation layer 320 and the opening 325. The second mask layer 350 may comprise a photoresist such as a positive photoresist. A positive photoresist is a type of photoresist in which the portion of the photoresist that is exposed to light becomes soluble to the photoresist developer. The portion of the photoresist that is unexposed remains insoluble to the photoresist developer. The second mask layer 350 may be an imide. The second mask layer 350 may comprise the same material or may comprise different materials than the first mask layer 340.

Figure 3E:
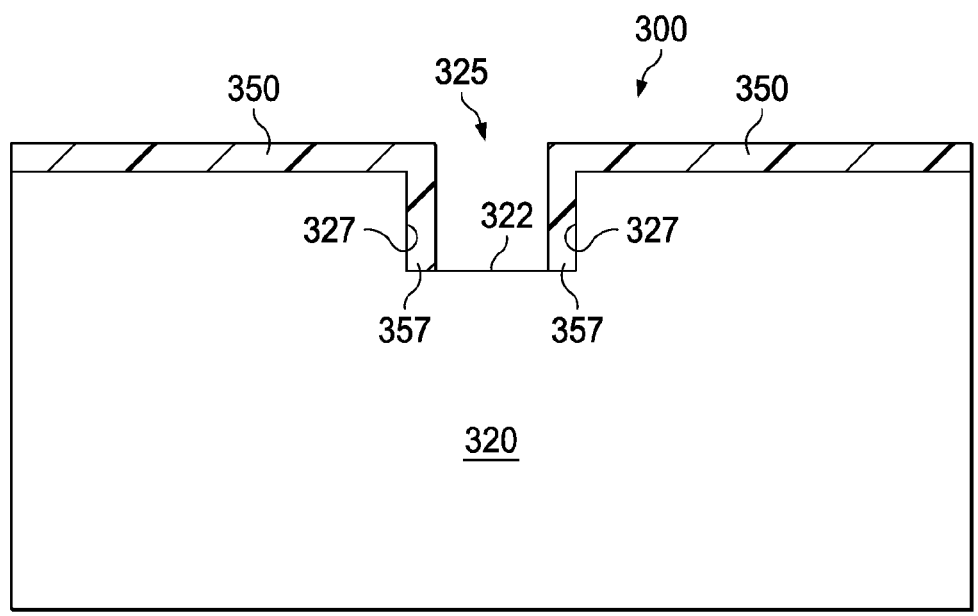

The second mask layer 350 is exposed to light and made soluble along the bottom surface 322 of the opening 325. In one embodiment the second mask layer 350 is exposed to light and made not soluble along the sidewalls 327 and/or the top surface of the isolation layer 320. The second mask layer 350 is exposed such that the exposure light is focused on the bottom surface 322 of the opening 325. Conversely, the second mask layer 350 is exposed such that the exposure light is not focused or defocused on the sidewalls 327 of the opening 325 and the top surface of the isolation layer 320. The second mask layer 350 is developed and removed, and since only the second mask layer 350 material along bottom surface 322 of the opening 325 is soluble this portion of the second mask layer 350 is removed exposing the bottom surface 322 of the opening 325 and forming sidewall spacers 357. This is shown in FIG. 3e. The sidewall spacers 357 may cover the entire depth of the sidewalls 327 or only a portion of the depth of the sidewalls 327. The trench depth to sidewall spacer depth can be 7/10, for example, but many different ratios up to a 1/10 ratio are possible. The ratios may be achieved by extending the opening 325 further into the isolation layer 320.

Figure 3F:
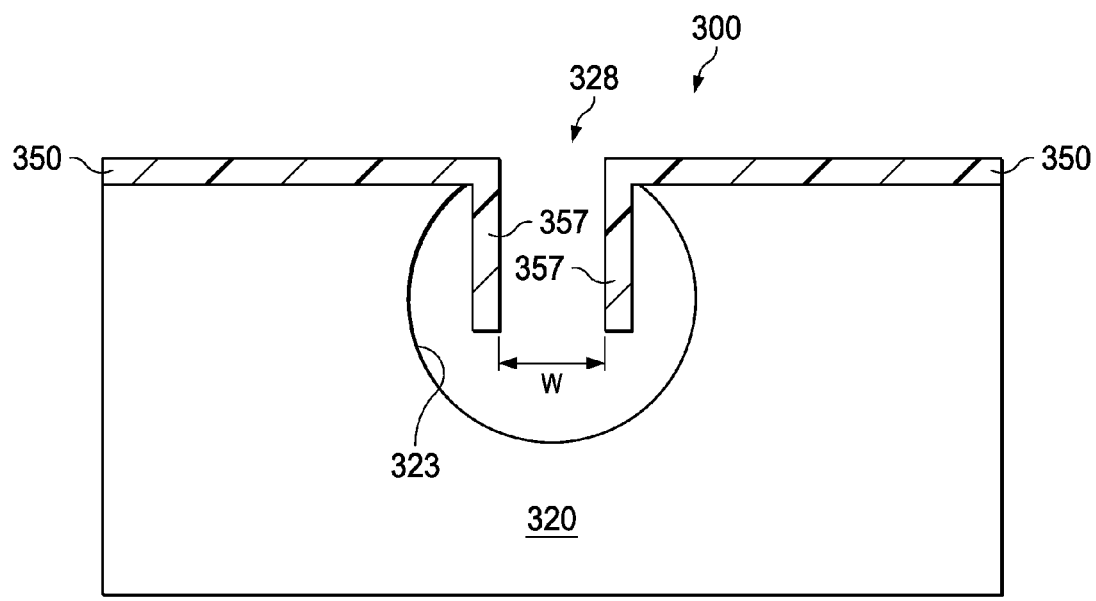

Next, an isotropic etch is applied to the opening 325 of the semiconductor device 300. The isotropic etch may be applied to the bottom surface 322 of the opening 325. The removal of the isolation layer 320 material starts at the exposed bottom surface 322 of the opening 325 and extends the opening 325 forming an extended opening 328. The extended opening 328 comprises a surface 323. This is shown in FIG. 3f. Alternatively, the removal of the isolation layer 320 material starts at the exposed sidewalls 327 and the bottom surface 322 of the opening 325. The isotropic etch removes isolation layer 320 material in the same or similar fashion as described with regard to FIG. 2f. Because the isotropic etch is selective to the second mask layer 350, including the sidewall spacers 357, the etch removes isolation layer 320 material but not or only barely the material of the second mask layer 350. FIG. 4a shows an extended opening 328 after performing the isotropic etch with sidewall spacers 352.

Alternatively, if the depth of the sidewall spacers of the second mask layer 350 is short relative to the depth of the opening 325, the removal of the isolation layer 320 material starts at the sidewalls 327 and the bottom surface 322 of the opening 325. FIG. 4b shows the extended opening 328 after performing the isotropic etch without or with short sidewall spacers 357.

The dimensions of the depth of the opening 325 and the width w of the opening 325 depend on the desired dimensions of the extended opening 328, e.g., the coil dimensions. An extended opening 328 formed by such an isotropic etch process and filled with a conductive material avoids or reduces excessive electrical field strength under operation.

The isotropic etch may comprise a wet etch. In one embodiment the wet etch comprises a HF (hydrogen fluoride) etching chemistry or a mixture thereof (e.g., $NH_4F:HF$ with a typical ratio of 30:6). Various etching rates can be achieved by varying the HF concentration and/ or the temperature of the etching mixture. HF etch rates on an oxide may be dependent on the properties and characteristics of the oxide. For example, a boron doped silicon oxide may etch slower than an undoped silicon oxide, while phosphorus or other 5-valant doped silicon oxide may etch faster than an undoped silicon oxide. Oxide density may also affect the etch rate. A dense oxide may etch slower than a not so dense oxide. Alternatively, the isotropic etch may comprise an isotropic dry etch (e.g., $NF_3$ or $SF_6$).

After the isotropic etch is carried out the sidewall spacers 357 may remain intact. The sidewall spacers 357 may not be etched by the isotropic etch. The sidewall spacers 357 may remain free standing extending in the extended opening 328 since the sidewalls 327 of the original trench 325 have been removed by the isotropic etch.

After the isotropic etch the semiconductor device 300 may be cleaned and/or dried. In one embodiment the sidewall spacers 332 have enough mechanical strength to withstand bending or breaking during cleaning and drying. Alternatively, if the sidewall spacers 332 do not have enough mechanical strength, supercritical drying can be used.

Figure 3G:
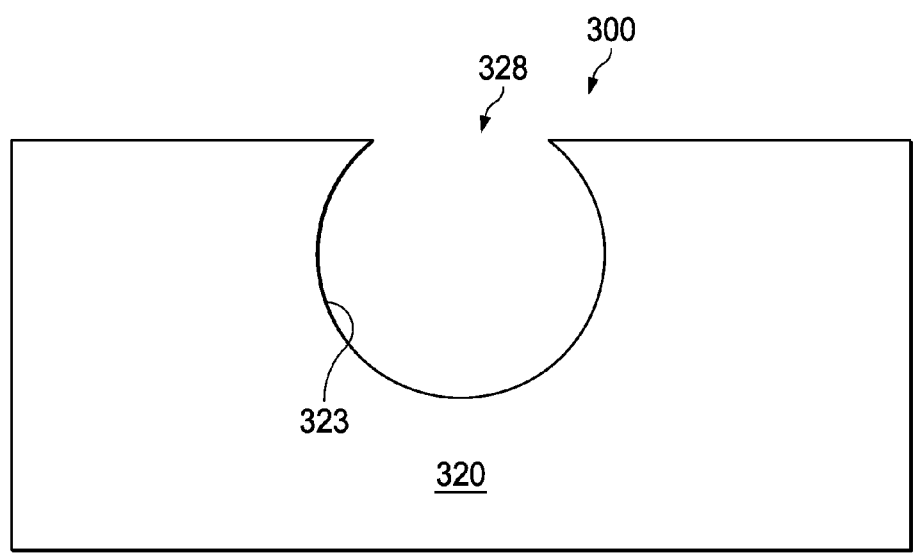

As can be seen from FIG. 3g, the second mask layer 350, including the sidewall spacers 357, is removed from top surface of the isolation layer 320 and in the extended opening 328. The second mask layer 350 can be removed by an O₂ plasma or liquid photoresist stripper.

Figure 3H:
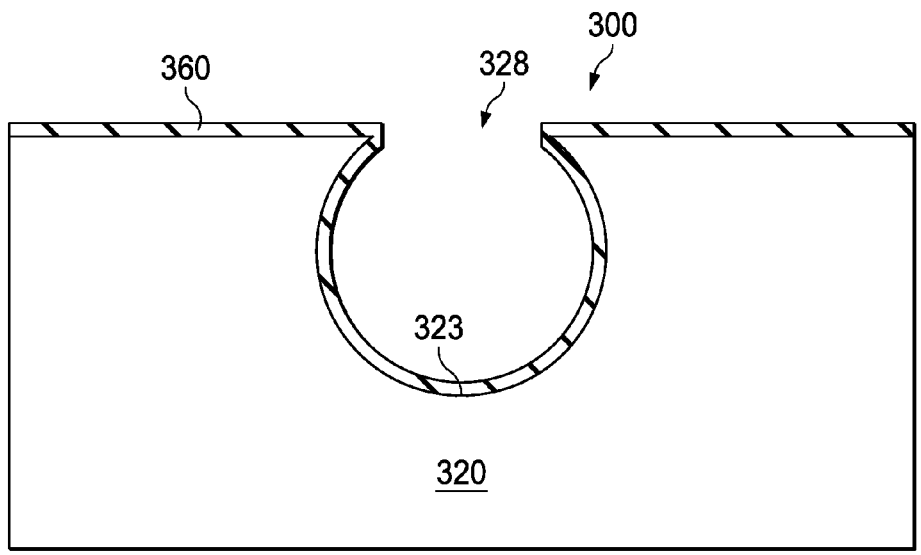

In FIG. 3h, a barrier layer 360 is formed on the top surface of the isolation layer 320 and on the surface 323 of the extended opening 328. The barrier layer 360 may comprise tantalum (Ta), tantalum nitride (TaN), titanium tungsten (TiW), or combinations thereof. The barrier layer 360 may be one layer or a plurality of layers. For example, the barrier layer 360 may be a tantalum nitride (TaN)/tantalum (Ta) bi-layer. The barrier layer 360 may be between about 5 nm and about 100 nm thick. In a bi-layer arrangement each layer may be between about 5 nm and about 100 nm thick. The barrier layer 360 in the extended opening 328 may be of uniform thickness or may be thicker in a lower part of the extended opening 360 and thinner in an upper part of the extended opening 328. Generally, there should be at least a barrier layer 360 of about 5 nm thickness in the upper part of the opening.

The barrier layer 360 may be formed applying bias sputtering. Alternatively, the barrier layer 360 may be formed using a CVD process.

Figure 3I:
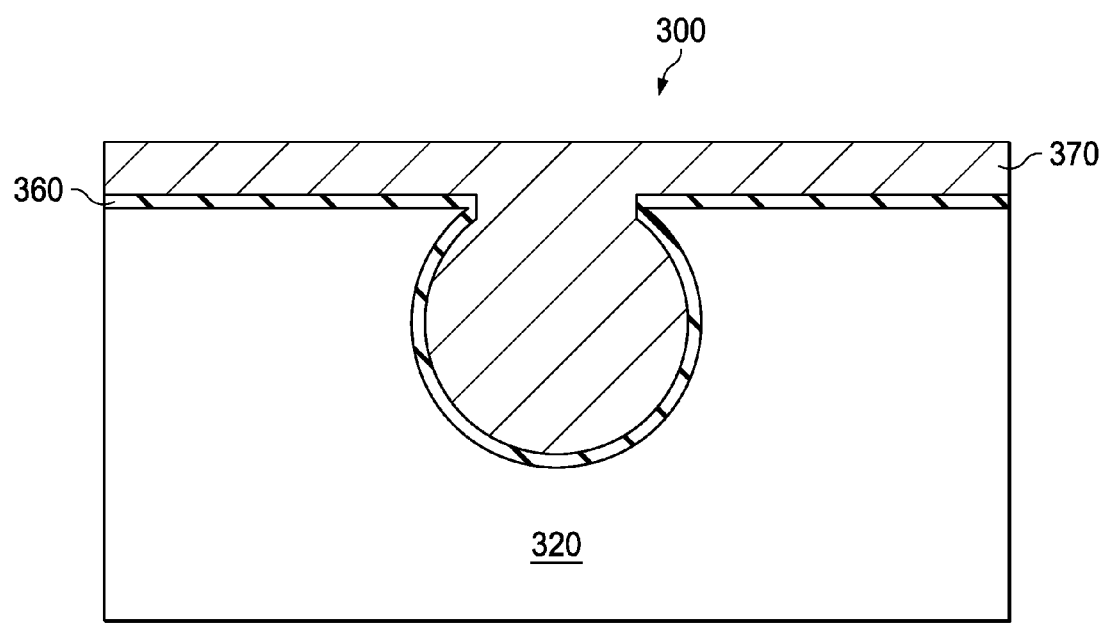

In FIG. 3i, the extended opening 328 may be filled with a conductive material 370. The conductive material 370 may be copper (Cu), copper alloys or aluminum (Al) or combinations thereof.

In one embodiment a conductive seed layer is formed or sputtered onto the barrier layer 360. The seed layer may cover the upper surface of the barrier layer 360 including the surface of the barrier layer in the upper part of the extended opening 328. The extended opening 328 is then completely filled with the conductive material. The extended opening 328 may be filled through an electro-plating process or an electroless-plating process. In one embodiment a copper (Cu) seed layer is first formed in the extended opening 328 and the extended opening is then filled with a Cu electro-plating process. In one embodiment the extended opening 328 is filled with a conductive material using a CVD process.

Figure 3J:
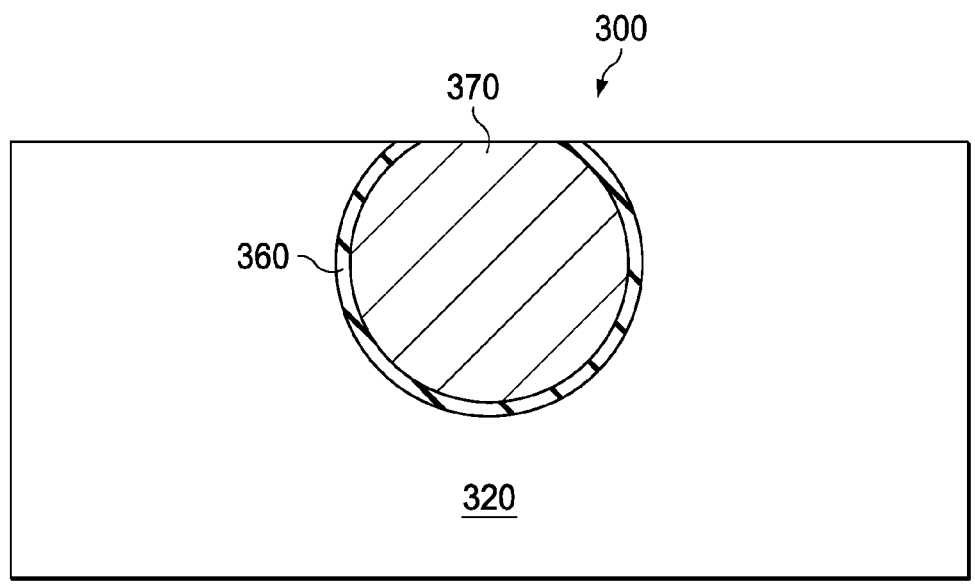

Conductive material formed outside of the extended opening 328 may be removed applying a chemical mechanical polishing (CMP) process, and a coil is formed in the isolation layer 320 as shown in FIG. 3j.

FIGS. 3a-3j only show the formation of a single coil winding in the isolation layer 320. However, the disclosed process covers also the formation of all windings in a coil as well as a plurality of coils in an isolation layer on a wafer, for example.

Figure 5:
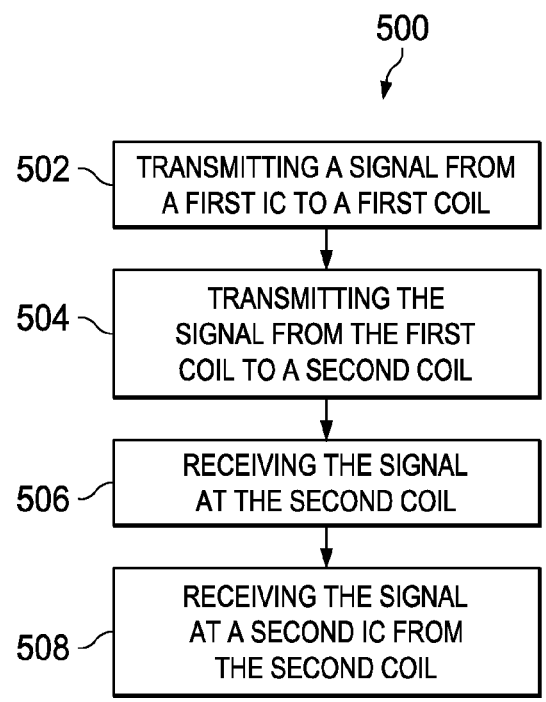
FIG. 5 shows an embodiment of a method of operating a coreless transformer.

FIG. 5 shows a flowchart 500 of signal being transmitted over a transformer. In a first step 502, the signal is transmitted from a first integrated circuit to a first coil. The first integrated circuit may comprise a transmitter. In the next step 504, the signal is transmitted from the first coil to the second coil. In one embodiment at least one coil of the transformer comprises a cross-section having a cross sectional surface as described with respect to FIGS. 4a and 4b. In another embodiment at least one coil of the transformer comprises a substantially circular circumference or substantially oval circumference in a cross section view. In yet other embodiments the at least one coil of the transformer comprises a curved shape in a cross sectional view. The curved cross sectional shape may be defined as free from angularity, as a continuously bending line without angles, as having no edges, or as being substantially round, substantially elliptical, substantially oval or substantially circular. In the next step 506 the signal is received at the second coil and in the final step, 508, the signal is received at the second integrated circuit. The second integrated circuit may comprise a receiver.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing a transformer, the method comprising:
   forming a first coil supported by a substrate;
   forming a dielectric layer over the substrate and the first coil; and
   forming a second coil in the dielectric layer substantially aligned with the first coil, wherein forming the second coil comprises:
      forming an opening in the dielectric layer;
      forming sidewall spacers along sidewalls of the opening in the dielectric layer, wherein each of the sidewall spacers comprises a first major surface contacting and facing a sidewall of the opening and an opposite, exposed second major surface;
      forming an extended opening using an isotropic wet etching so as to expose the first major surfaces of the sidewall spacers and the second major surfaces of the sidewall spacers up to a top surface of the dielectric layer;
      removing the sidewall spacers; and
      forming a conductive material in the extended opening.

2. The method according to claim 1, further comprising forming a conductive liner in the extended opening.

3. The method according to claim 1, wherein the dielectric layer is a single dielectric layer.

4. The method according to claim 1, wherein forming the extended opening using the isotropic wet etching comprises a substantially homogenous isotropic wet etching of the dielectric layer.

5. A method for manufacturing a device, the method comprising:
   forming a dielectric layer over a substrate, the dielectric layer having a top surface facing away from the substrate; and
   forming a coil in the dielectric layer, wherein forming the coil comprises:
      forming an opening extending into the dielectric layer from the top surface of the dielectric layer;
      forming spacers along sidewalls of the opening in the dielectric layer each of the spacers comprising first sidewalls facing the opening and opposite second sidewalls facing the dielectric layer;
      forming an extended opening using an isotropic wet etching so as to expose the first sidewalls and the second sidewalls up to the top surface of the dielectric layer;
      removing the spacers after forming the extended opening; and
      forming a conductive material in the extended opening.

6. The method according to claim 5, further comprising forming a conductive liner in the extended opening.

7. The method according to claim 5, wherein the dielectric layer is a single dielectric layer.

8. The method according to claim 5, wherein forming the extended opening using the isotropic wet etching comprises a substantially homogenous isotropic wet etching of the dielectric layer.

9. The method according to claim 5, wherein forming spacers along sidewalls of the opening in the dielectric layer comprises depositing polycrystalline silicon and performing an anisotropic etching process to form the spacers comprising the polycrystalline silicon.

10. The method according to claim 5, wherein forming spacers along sidewalls of the opening in the dielectric layer comprises depositing silicon oxide and performing an anisotropic etching process to form the spacers comprising the silicon oxide.

11. The method according to claim 5, wherein forming spacers along sidewalls of the opening in the dielectric layer comprises depositing silicon nitride and performing an anisotropic etching process to form the spacers comprising the silicon nitride.

12. The method according to claim 5, wherein forming spacers along sidewalls of the opening in the dielectric layer comprises depositing photoresist and performing an anisotropic etching process to form the spacers comprising the photoresist.

13. The method according to claim 5, wherein forming spacers along sidewalls of the opening in the dielectric layer comprises depositing a metal layer and performing an anisotropic etching process to form the spacers comprising the metal layer.

14. The method according to claim 5, wherein the isotropic wet etching comprises applying a fluorine based etching chemistry.

15. The method according to claim 14, wherein fluorine based etching chemistry comprises a HF based etching chemistry.

16. The method according to claim 5, wherein forming the extended opening comprises forming curved sidewalls in a lower region having a first radius of curvature and forming curved sidewalls in an upper region having a second radius of curvature, the first radius of curvature being larger than the second radius of curvature.

\* \* \* \* \*